(12) United States Patent
Tsai et al.

(10) Patent No.: US 8,076,235 B2
(45) Date of Patent: Dec. 13, 2011

(54) SEMICONDUCTOR DEVICE AND FABRICATION METHOD THEREOF

(75) Inventors: Kuan-Chi Tsai, Kaohsiung (TW);
Chih-Hsun Lin, Kaohsiung (TW);
Sheng-Wen Su, Kaohsiung (TW);
Shaw-Jang Liou, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/913,142

(22) Filed: Oct. 27, 2010

(65) Prior Publication Data
US 2011/0039408 A1    Feb. 17, 2011

Related U.S. Application Data

(62) Division of application No. 11/176,924, filed on Jul. 7, 2005, now Pat. No. 7,846,832.

(51) Int. Cl.
*H01L 21/768* (2006.01)
*H01L 21/108* (2006.01)
*H01L 23/528* (2006.01)

(52) U.S. Cl. ......................... 438/627; 438/637

(58) Field of Classification Search ................. None
See application file for complete search history.

(56) References Cited

U.S. PATENT DOCUMENTS

| | | | |
|---|---|---|---|
| 6,013,581 | A | 1/2000 | Wu et al. |
| 6,537,896 | B1 | 3/2003 | Catabay et al. |
| 6,613,666 | B2 | 9/2003 | Ma |
| 6,656,841 | B1 | 12/2003 | Kim |
| 6,677,251 | B1 | 1/2004 | Lu et al. |
| 2001/0016418 | A1 | 8/2001 | Kim |
| 2005/0059232 | A1 | 3/2005 | Andreas |
| 2005/0230831 | A1 | 10/2005 | Clevenger et al. |
| 2006/0151887 | A1 | 7/2006 | Oh et al. |

*Primary Examiner* — Zandra Smith
*Assistant Examiner* — Pamela E Perkins
(74) *Attorney, Agent, or Firm* — Thomas|Kayden

(57) ABSTRACT

Semiconductor devices and methods for fabricating the same. The devices includes a substrate, a first etch stop layer, a dielectric layer, an opening, and an anti-diffusion layer. The first etch stop layer overlies the substrate. The dielectric layer overlies the first etch stop layer. The opening extends through the dielectric layer and the first etch stop layer, and exposes parts of the substrate. The anti-diffusion layer overlies at least sidewalls of the opening, preventing contamination molecule diffusion from at least the first etch stop layer, wherein the anti-diffusion layer is respectively denser than the first etch stop layer and the dielectric layer.

11 Claims, 7 Drawing Sheets

SEMICONDUCTOR DEVICE AND FABRICATION METHOD THEREOF

CROSS REFERENCE TO RELATED APPLICATIONS

This application is a divisional of U.S. patent application Ser. No. 11/176,924, filed Jul. 7, 2005, entitled, "Semiconductor Device and Fabrication Method Thereof," the entirety of which is incorporated herein by reference.

BACKGROUND

The invention relates to semiconductor technology, and more specifically to plasma applications.

In semiconductor fabrication, various layers of insulating material, semiconductor material and conducting material are formed to produce a multi-level semiconductor device. One of the limiting factors in the continuing evolution toward smaller device size and higher density is resist scum problem.

FIGS. 1A through 1B show how resist scum affects a damascene process.

In FIG. 1A, a substrate 100 comprises an interconnection 110 on a surface. A first etch stop layer 121, a dielectric layer 122, and a second etch stop layer 123 sequentially overlie the substrate 100. Layers 121 through 123 are patterned, forming an opening 125 through layers 121 through 123, exposing the interconnection 110. A resist layer 130 is formed overlying the substrate 100 for patterning the layers 122 and 123 to form a dual damascene structure. A region A indicates a predetermined exposure region in the resist layer 130. When region A is illuminated by an energy ray, photoacids are formed therein to assist development of the resist layer 130.

Unfortunately, the layer 121 is typically formed by chemical vapor deposition (CVD), and alkaline molecules such as ammonia, one of the precursors for the layer 121, may remain in the layer 121 and tend to diffuse therefrom. Conventionally, a degassing process is performed prior to forming the resist layer 130, but rarely completely purges the alkaline molecules from the layer 121. The alkaline molecules still diffuse into the resist layer 130, resulting in neutralization of the photo acids. Neutralization between the alkaline molecules and the photo acids may cause incomplete development of the resist layer 130, leaving scum 131 in a resist opening 135 as shown in FIG. 1B.

Next, the layers 122 and 123 exposed in the resist opening 135 are etched utilizing the patterned resist layer 130 as an etch mask to form a dual damascene opening 126 as shown in FIG. 1C. Scum 131 may also act as etch masks until exhaustion, resulting in formation of ridges 126a where the scum 131 remains.

In FIG. 1D a conductive material is formed to fill the opening 126 as an interconnection 140. The ridges 126a induce high impedance problem in the interconnection 140 due to cross-section reduction of the interconnection 140 in regions B and C, resulting in device failure during electron migration, stress migration, or other reliability testing, negatively affecting device reliability and process cost.

SUMMARY

Thus, embodiments of the invention provide semiconductor devices and methods for fabricating the same, preventing formation of resist scum, thereby improving device reliability and process cost.

Embodiments of the invention provide a semiconductor device. The device comprises a substrate, a first etch stop layer, a dielectric layer, an opening, and an anti-diffusion layer. The first etch stop layer overlies the substrate. The dielectric layer overlies the first etch stop layer. The opening extends through the dielectric layer and the first etch stop layer, and exposes parts of the substrate. The anti-diffusion layer overlies at least sidewalls of the opening, preventing contamination molecule diffusion from at least the first etch stop layer, wherein the anti-diffusion layer is respectively denser than the first etch stop layer and the dielectric layer.

Embodiments of the invention further provide a semiconductor device. The device comprises a substrate, a first etch stop layer, a dielectric layer, an opening, an anti-diffusion layer, and a conductive material. The substrate comprises a conductive region. The first etch stop layer overlies the substrate. The dielectric layer overlies the first etch stop layer. The opening, through the dielectric layer and the first etch stop layer, comprises a narrow portion and a wide portion exposing the narrow portion and exposes parts of the conductive region. The anti-diffusion layer overlies sidewalls of the narrow portion of the opening, preventing contamination molecule diffusion from at least the first etch stop layer, wherein the anti-diffusion layer is respectively denser than the first etch stop layer and the dielectric layer. The conductive material fills the opening, electrically connected to the conductive region of the substrate.

Embodiments of the invention further provide a method for fabricating a semiconductor device. First, a substrate, comprising a first etch stop layer overlying the substrate, a dielectric layer overlying the first etch stop layer, and an opening through the dielectric layer and the first etch stop layer, exposing parts of the substrate, is provided. Finally, plasma treatment is performed on the exposed first etch stop layer and dielectric layer, forming an anti-diffusion layer overlying at least sidewalls of the opening, preventing contamination molecule diffusion from at least the first etch stop layer, wherein the anti-diffusion layer is respectively denser than the first etch stop layer and the dielectric layer.

Further scope of the applicability of the invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention can be more fully understood by reading the subsequent detailed description in conjunction with the examples and references made to the accompanying drawings, which are given by way of illustration only, and thus are not limitative of the invention, and wherein.

DESCRIPTION

The following embodiments are intended to illustrate the invention more fully without limiting the scope of the claims, since numerous modifications and variations will be apparent to those skilled in this art.

Figure 2A:
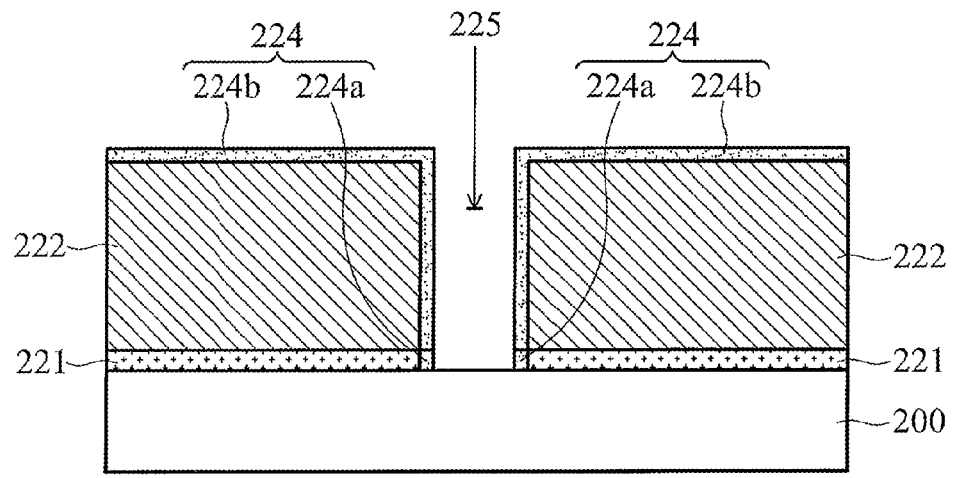
FIGS. 2A through 2C are cross-sections of semiconductor devices of some embodiments of the invention.

FIG. 2A shows a semiconductor device of one embodiment of the invention. The device comprises a substrate 200, a first etch stop layer 221, a dielectric layer 222, and an anti-diffusion layer 224.

The substrate 200 comprises semiconductor materials such as silicon, germanium, silicon germanium, compound semiconductor, or other known semiconductor materials. The substrate 200 typically comprises processed active devices, such as diodes, transistors, or other known active devices, (not shown) therein.

The first etch stop layer 221 overlies the substrate 200. The first etch stop layer 221 is formed by CVD utilizing precursors comprising alkaline molecules. The alkaline molecules may remain in the layer 221 acting as potential contamination molecules. When the first etch stop layer 221 comprises silicon carbide, for example, the precursors typically comprise trimethoxysilane and ammonia (alkaline).

The dielectric layer 222, such as low k dielectrics, is formed by a method such as spin coating, CVD, or other methods overlying the first etch stop layer 221. In some embodiments, the dielectric layer 222 may comprise potential contamination molecules such as alkaline molecules as aforementioned therein.

An opening 225, such as a via for interconnection, is formed through the layers 221 and 222 and exposes parts of the substrate 200. An anti-diffusion layer 224, preventing contamination molecule, i.e. the alkaline molecules, diffusion from at least the first etch stop layer 221, overlies at least sidewalls of the opening 225. When the dielectric layer 222 comprises the potential contamination molecules, the anti-diffusion layer 224 preferably extends to overlie other exposed surfaces of the layer 222 as shown in FIG. 2A. Further, the layer comprises a first part 224a overlying the first etch stop layer 221 and a second part 224b overlying the dielectric layer 222. The first part 224a is denser than the first etch stop layer 221, and the second part 224b is denser than the dielectric layer 222. The first part 224a is a densified part of the first etch stop layer 221, and comprises the same material as the first etch stop layer 221. The second part 224b is a densified part of the dielectric layer 222, and comprises the same material as the dielectric layer 222.

Figure 2B:
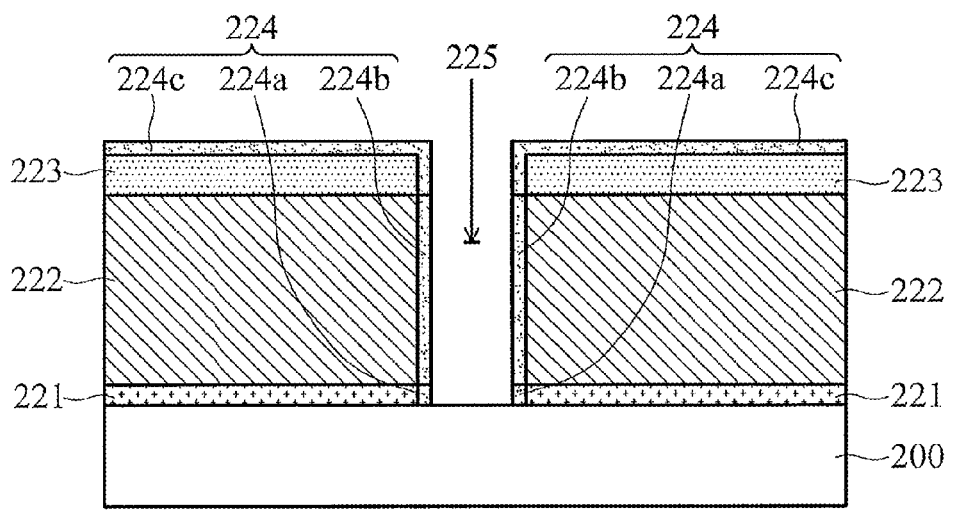

In an alternative embodiment, the semiconductor device may further comprise a second etch stop layer 223 overlying the layer 222 as shown in FIG. 2B. In one embodiment, the layer 223 comprises silicon oxynitride formed by CVD. For the same reason as described, the layer 224 may further extend to overlie other exposed surfaces of the layer 223. In this embodiment, the layer 224 further comprises a third part 224c overlying the second etch stop layer 223. The third part 224c is denser than the second etch stop layer 223. The third part 224c is a densified part of the second etch stop layer 223, and comprises the same material as the second etch stop layer 223.

Figure 2C:
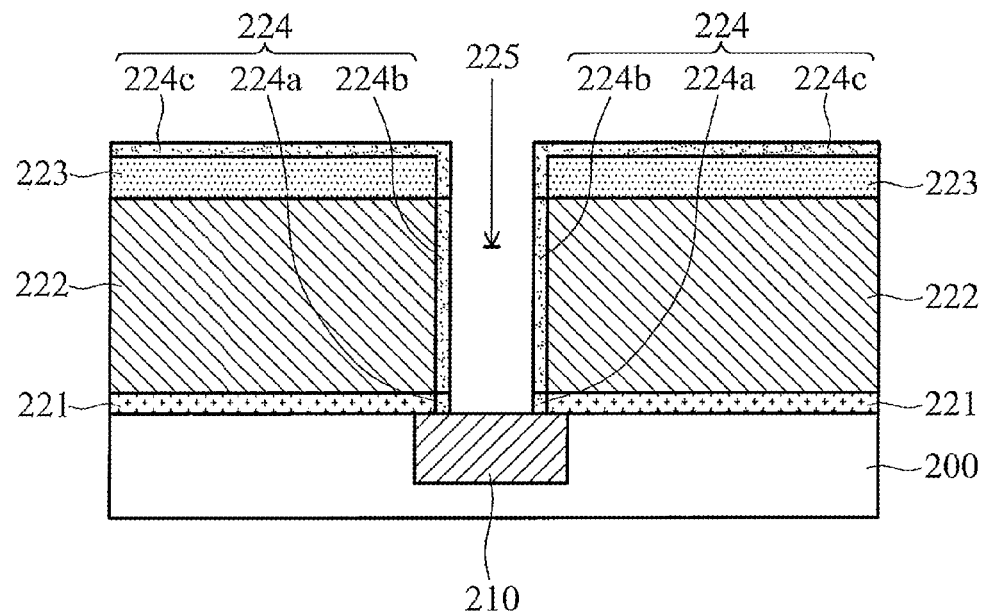

In an alternative embodiment, the substrate 200 may further comprise a conductive region 210 exposed by the opening 225 as shown in FIG. 2C. The conductive region 210 may be doped substrate 200, doped polycrystalline silicon, or metal, such as copper, aluminum, copper-aluminum alloys, tungsten, or transparent electrodes. In some embodiments, the conductive region 210 may comprise conductive metal oxide, metal silicide, or metal nitride.

Figure 3A:
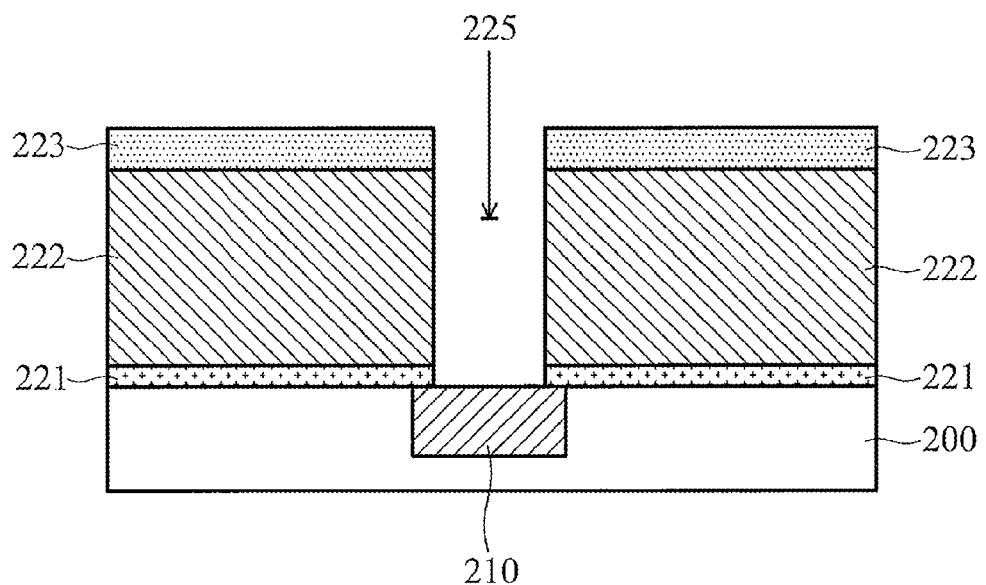
FIGS. 3A through 3C are cross-sections of a method for fabricating semiconductor devices of the invention.
Figure 3B:
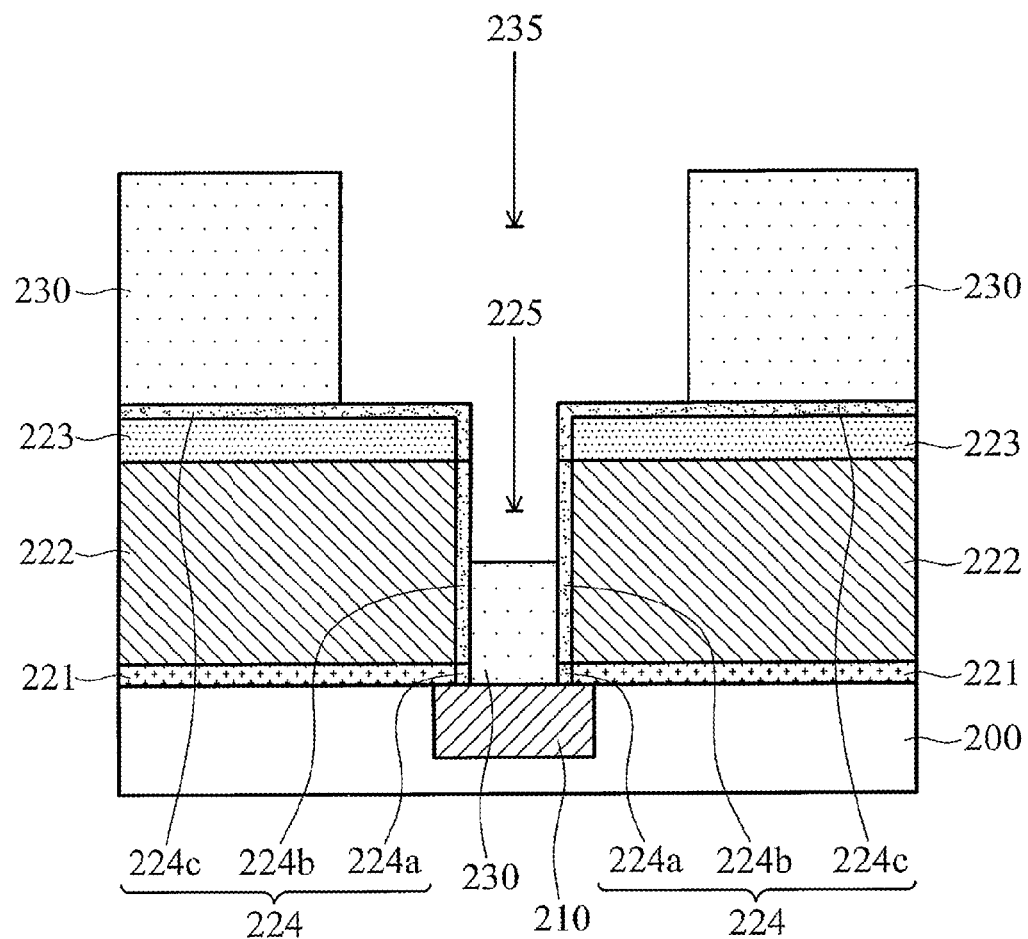
Figure 3C:
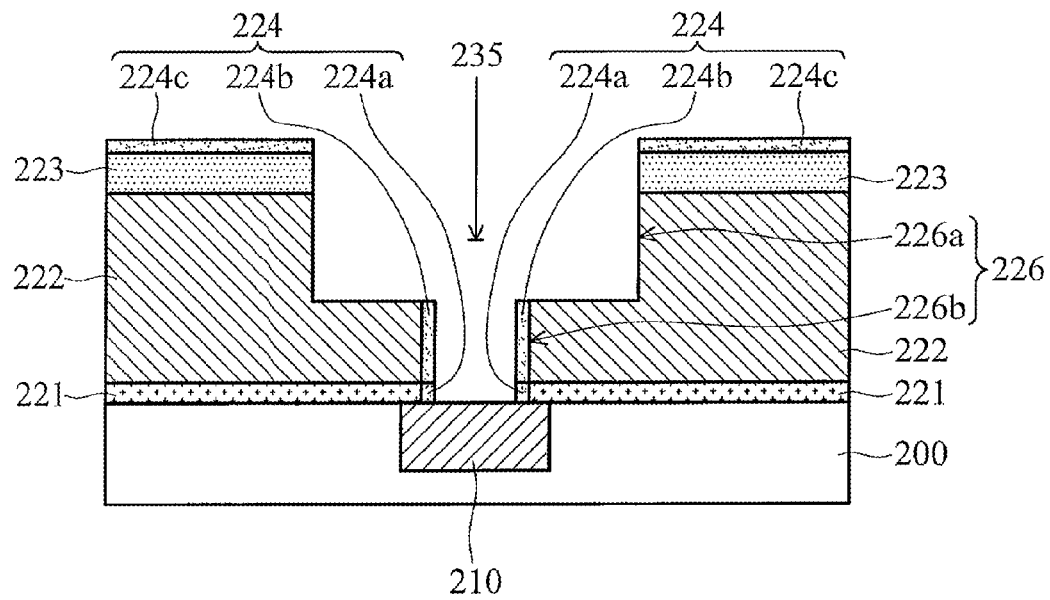

FIGS. 3A through 3C are cross-sections of a method for fabricating semiconductor devices of the invention.

In FIG. 3A, first, a substrate 200, comprising a first etch stop layer 221 overlying the substrate 200, a dielectric layer 222 overlying the first etch stop layer 222, and an opening 225 through the dielectric layer 222 and the first etch stop layer 221, exposing parts of the substrate 200, is provided. In some embodiments, an optional second etch stop layer 223 further overlies the dielectric layer 222 and the opening 225 further extends through the second etch stop layer 223. In some embodiments, the substrate 200 further comprises a conductive region 210. Details regarding the substrate 200, conductive region 210, layers 221 through 224, and opening 225 are the same as described, and thus, are omitted herefrom.

Next, plasma treatment is performed on the exposed first etch stop layer 221 and dielectric layer 222. When the structure comprises the optional second etch stop layer 223, the second etch stop layer 223 is treated by plasma simultaneously with the layers 221 and 222. The structure shown in FIG. 3A is transferred to a chamber for plasma treatment, followed by application of bias thereto and infusion with plasma. Gas utilized in the plasma treatment may comprise hydrogen, helium, nitrogen, oxygen, or argon, performed at a temperature between approximately 10° C. and room temperature, at between approximately 250 and approximately 500 watts. During the plasma treatment, the surface is densified by plasma, forming anti-diffusion layer 224 comprising the first part 224a and the second part 224b respectively denser than the underlying layers such as layers 221 and 222. The anti-diffusion layer 224 may further extend to overlie and further comprises the third part 224c denser than the underlying second etch stop layer 223. Thus, the semiconductor device of either of those as shown in FIGS. 2A through 2C is completed.

Contamination molecules remaining in the layer 221, as described, may diffuse into the exposed surfaces in FIG. 3A. In this case, the plasma treatment may not only form the anti-diffusion layer 224, but also clean potential contamination molecules from the exposed surfaces in FIG. 3A.

Following that shown in FIG. 2C, for example, a resist layer 230 is formed overlying the layers 221 through 223 as shown in FIG. 3B, followed by patterning of the resist layer 230 to provide an etch mask comprising an opening 235 expanding the opening 225 to form a damascene structure. Those skilled in the art will recognize the possibility of performing applicant of the resist layer 230 and the subsequently mentioned procedures on those shown in FIGS. 2A and 2B.

When patterning the resist layer 230 shown in FIG. 3B, the second etch stop layer 223 prevents contamination molecules such as alkaline molecules remaining in the underlying layers such as the layer 221 from diffusing into the resist layer 230. Thus, the exposed resist in the opening 235 is completely removed during development, and no scum remains.

Next, layers 222 and 223 are etched utilizing the patterned resist layer 230 as an etch mask to partially expand the opening 225, forming a dual damascene opening 226 as shown in FIG. 3C after the patterned resist layer 230 is removed. The opening 226 comprises a narrow portion 226b and a wide portion 226a exposing the narrow portion 226b. No ridge as shown in the conventional application is formed in the opening 226. In FIG. 3B, the resist layer 230 at bottom of the opening 225 protects the corresponding layer 224 during etching, resulting in the layer 224 remaining overlying sidewalls of the narrow portion 226b.

Figure 4:
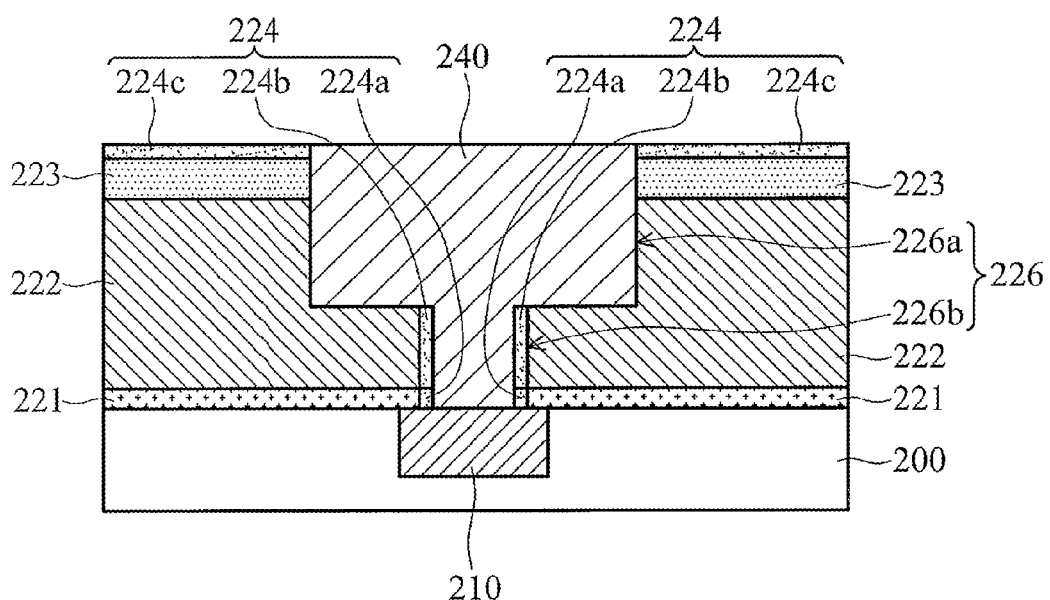
FIG. 4 is a cross-section of a semiconductor device of an alternative embodiment of the invention.

Finally, a conductive material 240 is formed to fill the opening 226, electrically connecting to the conductive region 210 as shown in FIG. 4. The conductive material 240 preferably comprises doped polycrystalline silicon, metal, or metal alloys, such as aluminum, copper-aluminum alloys, tungsten, metal nitrides, metal silicides, or combinations thereof, or alternatively, copper, in which case a barrier layer (not shown)

is preferably disposed along sidewalls of the opening 226 preventing copper from diffusing into the layers 221 through 223.

Figure 1A:
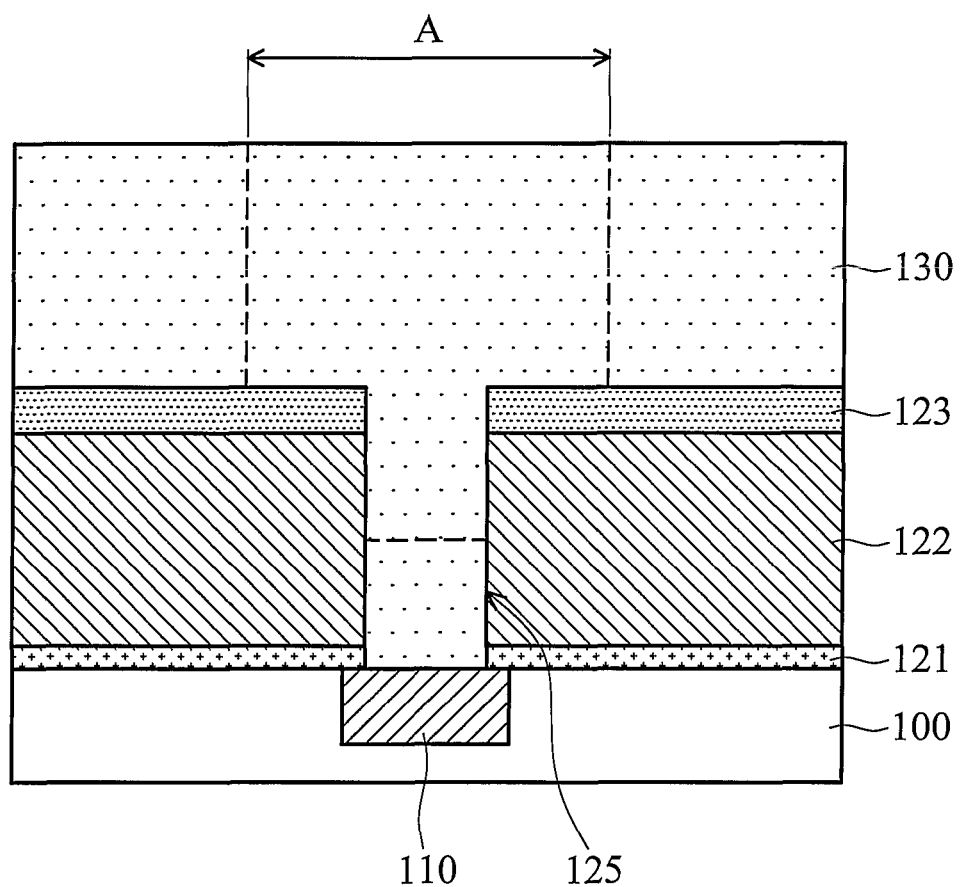
FIGS. 1A through 1D are cross-sections of a conventional method.
Figure 1B:
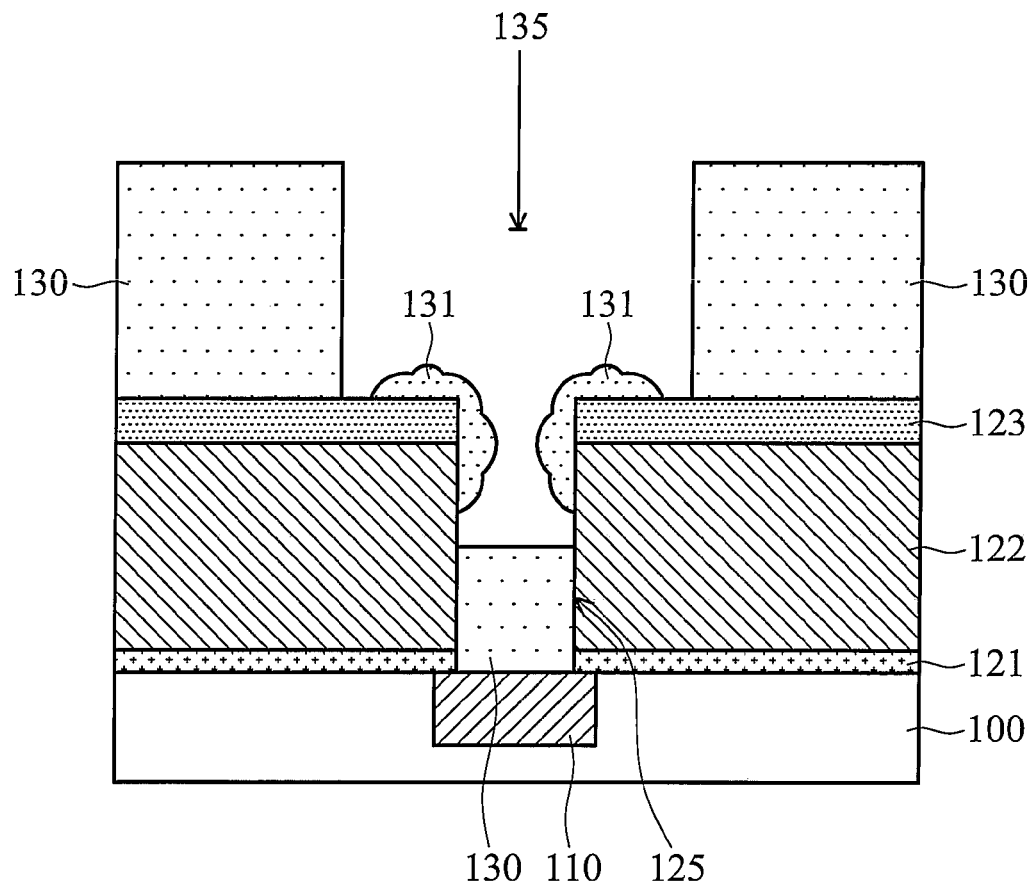
Figure 1C:
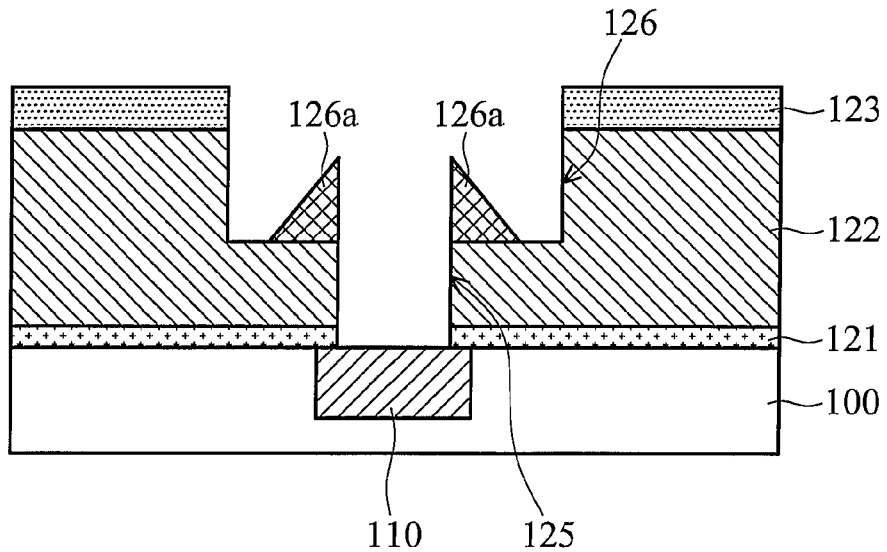
Figure 1D:
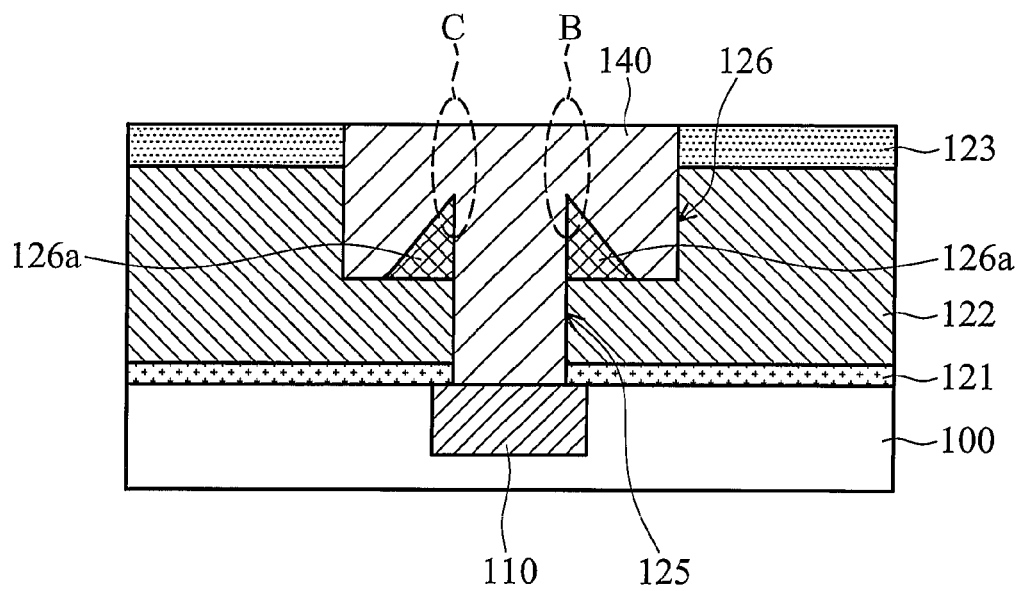

Due to the absence of ridges in the opening 226, when the conductive material 240 is utilized as an interconnection of the semiconductor device, cross-section reduction as shown in FIG. 1D does not occurred, preventing conventional high impedance problems and improving device reliability and process cost. Further, the conventional degassing step can be omitted due to the anti-diffusion layer 224 preventing contaminant molecules from diffusing into the resist layer 230.

Further, FIG. 4 shows a semiconductor device of another embodiment of the invention. The substrate 200 comprises conductive region 210. The first etch stop layer 221 overlies the substrate 200. The dielectric layer 222 overlies the first etch stop layer 221. The opening 226, through the dielectric layer 222 and the first etch stop layer 221, comprises a narrow portion 226b and a wide portion 226a exposing the narrow portion 226b and exposes parts of the conductive region 210. The anti-diffusion layer 224 overlies sidewalls of the narrow portion 226b of the opening, preventing contamination molecule diffusion from at least the first etch stop layer 221, wherein the anti-diffusion layer 224 is respectively denser than the underlying layers. The conductive material 240 fills in the opening 226, electrically connecting to the conductive region 210 of the substrate 200. Optionally, the semiconductor device comprises the second etch stop layer 223 overlying the dielectric layer 222, wherein the opening 226 extends through the second etch stop layer 223. In some embodiments, the anti-diffusion layer 224 is further disposed overlying the second etch stop layer 223 beyond the opening 226.

While the invention has been described by way of example and in terms of preferred embodiment, it is to be understood that the invention is not limited thereto. It is therefore intended that the following claims be interpreted as covering all such alteration and modifications as fall within the true spirit and scope of the invention.

What is claimed is:

1. A fabrication method for a semiconductor device, comprising:
    providing a substrate comprising a first etch stop layer overlying the substrate, a dielectric layer overlying the first etch stop layer, and an opening through the dielectric layer and the first etch stop layer, exposing parts of the substrate, wherein the opening comprises a narrow portion and a wide portion exposing the narrow portion; and
    performing plasma treatment on the exposed first etch stop layer and dielectric layer, forming an insulating anti-diffusion layer overlying at least sidewalls of the narrow portion of the opening and overlying the dielectric layer beyond the wide portion of the opening, but not overlying sidewalls of the wide portion of the opening, preventing contamination molecule diffusion from at least the first etch stop layer, wherein the insulating anti-diffusion layer is respectively denser than the first etch stop layer and the dielectric layer.

2. The method as claimed in claim 1, wherein the substrate further comprises a second etch stop layer overlying the dielectric layer, and the opening further extends through the second etch stop layer.

3. The method as claimed in claim 2, wherein the second etch stop layer is treated by plasma simultaneously with the exposed first etch stop layer and dielectric layer, further extending the anti-diffusion layer to overlie the second etch stop layer.

4. The method as claimed in claim 1, wherein the plasma treatment utilizes hydrogen, helium, nitrogen, oxygen, or argon.

5. The method as claimed in claim 1, wherein the plasma treatment is performed at between approximately 10° C. and room temperature.

6. The method as claimed in claim 1, wherein the plasma treatment is performed at a power between approximately 250 and approximately 500 watts.

7. A fabrication method for a semiconductor device, comprising:
    providing a substrate comprising a first etch stop layer overlying the substrate, a dielectric layer overlying the first etch stop layer, and an opening through the dielectric layer and the first etch stop layer, exposing parts of the substrate; and
    performing plasma treatment on the exposed first etch stop layer and dielectric layer, forming an anti-diffusion layer overlying at least sidewalls of the opening, preventing contamination molecule diffusion from at least the first etch stop layer, wherein the anti-diffusion layer is respectively denser than the first etch stop layer and the dielectric layer and wherein the plasma treatment is performed at between approximately 10° C. and room temperature.

8. The method as claimed in claim 7, wherein the substrate further comprises a second etch stop layer overlying the dielectric layer, and the opening further extends through the second etch stop layer.

9. The method as claimed in claim 8, wherein the second etch stop layer is treated by plasma simultaneously with the exposed first etch stop layer and dielectric layer, further extending the anti-diffusion layer to overlie the second etch stop layer.

10. The method as claimed in claim 7, wherein the plasma treatment utilizes hydrogen, helium, nitrogen, oxygen, or argon.

11. The method as claimed in claim 7, wherein the plasma treatment is performed at a power between approximately 250 and approximately 500 watts.

* * * * *